United States Patent
Jensen (10) Patent No.: US 7,469,137 B2
(45) Date of Patent: Dec. 23, 2008

(54) RADIO RECEIVER DC OFFSET CANCELLATION VIA ADC INPUT BIAS

(75) Inventor: Henrik T. Jensen, Long Beach, CA (US)

(73) Assignee: Broadcom Corporation, Irvine, CA (US)

( * ) Notice: Subject to any disclaimer, the term of this patent is extended or adjusted under 35 U.S.C. 154(b) by 583 days.

(21) Appl. No.: 11/015,176

(22) Filed: Dec. 17, 2004

(65) Prior Publication Data

US 2006/0135111 A1 Jun. 22, 2006

(51) Int. Cl.
*H04B 1/28* (2006.01)
(52) U.S. Cl. .................. 455/333; 455/324; 455/312; 455/266; 375/345; 375/346; 375/350
(58) Field of Classification Search ........... 455/333, 455/334, 312, 324, 266; 375/345, 346, 350
See application file for complete search history.

(56) References Cited

U.S. PATENT DOCUMENTS

| | | | |
|---|---|---|---|
| 6,366,622 B1 * | 4/2002 | Brown et al. ............. | 375/322 |
| 6,700,514 B2 * | 3/2004 | Soltanian et al. ........... | 341/118 |
| 6,985,711 B2 * | 1/2006 | Holenstein et al. .......... | 455/312 |
| 7,038,783 B2 * | 5/2006 | Standjord et al. ........... | 356/460 |
| 2005/0123072 A1 * | 6/2005 | Guimaraes .................. | 375/319 |
| 2005/0250459 A1 * | 11/2005 | Tervaluoto et al. ....... | 455/127.2 |

* cited by examiner

*Primary Examiner*—Sanh D Phu
(74) *Attorney, Agent, or Firm*—Garlick Harrison & Markison; James A. Harrison (57) ABSTRACT

A scaled input current is produced that substantially matches the full scale input of a CT$\Delta\Sigma$ADC that substantially cancels an offset bias current component of the input current. A bias resistance value is coupled between the integrator input and one of a supply voltage and a circuit common. Generally, the system is operable to produce digital data based on the filtered IF signals based on an analog feedback signal and upon an offset compensation signal wherein the analog feedback signal is based upon the digital data. Offset compensation logic is operable to detect an amount of DC offset in a digital IF demodulated digital serial data and producing the offset compensation control signal based upon the detected amount of DC. A programmable bias current is operable to substantially cancel a bias voltage component of the received analog feedback signal based upon an offset compensation control signal.

19 Claims, 10 Drawing Sheets

RADIO RECEIVER DC OFFSET CANCELLATION VIA ADC INPUT BIAS

BACKGROUND

1. Technical Field

The present invention relates to communication systems and, more particularly, to analog-to-digital and digital-to-analog converters used within transceivers.

2. Related Art

Communication systems are known to support wireless and wire lined communications between wireless and/or wire lined communication devices. Such communication systems range from national and/or international cellular telephone systems to the Internet to point-to-point in-home wireless networks. Each type of communication system is constructed, and hence operates, in accordance with one or more communication standard. For instance, wireless communication systems may operate in accordance with one or more standards, including, but not limited to, IEEE 802.11, Bluetooth, advanced mobile phone services (AMPS), digital AMPS, global system for mobile communications (GSM), code division multiple access (CDMA), local multi-point distribution systems (LMDS), multi-channel-multi-point distribution service (MMDS), and/or variations thereof.

Depending on the type of wireless communication system, a wireless communication device, such as a cellular telephone, two-way radio, personal digital assistant (PDA), personal computer (PC), laptop computer, home entertainment equipment, etc., communicates directly or indirectly with other wireless communication devices. For direct communications (also known as point-to-point communications), the participating wireless communication devices tune their receivers and transmitters to the same channel or channels (e.g., one of a plurality of radio frequency (RF) carriers of the wireless communication system) and communicate over that channel(s). For indirect wireless communications, each wireless communication device communicates directly with an associated base station (e.g., for cellular services) and/or an associated access point (e.g., for an in-home or in-building wireless network) via an assigned channel. To complete a communication connection between the wireless communication devices, the associated base stations and/or associated access points communicate with each other directly, via a system controller, via the public switched telephone network (PSTN), via the Internet, and/or via some other wide area network.

Each wireless communication device includes a built-in radio transceiver (i.e., receiver and transmitter) or is coupled to an associated radio transceiver (e.g., a station for in-home and/or in-building wireless communication networks, RF modem, etc.) that performs analog signal processing tasks as a part of converting data to a radio frequency (RF) signal for transmission and a received RF signal to data.

As is known, the transmitter includes a data modulation stage, one or more intermediate frequency stages, and a power amplifier. The data modulation stage converts raw data into baseband signals in accordance with the particular wireless communication standard. The one or more intermediate frequency stages mix the baseband signals with one or more local oscillations to produce RF signals. The power amplifier amplifies the RF signals prior to transmission via an antenna.

As is also known, the receiver is coupled to the antenna and includes a low noise amplifier, one or more intermediate frequency stages, a filtering stage, and a data recovery stage. The low noise amplifier receives an inbound RF signal via the antenna and amplifies it. The one or more intermediate frequency stages mix the amplified RF signal with one or more local oscillations to convert the amplified RF signal into a baseband signal or an intermediate frequency (IF) signal. As used herein, the term "low IF" refers to both baseband and intermediate frequency signals.

A filtering stage filters the low IF signals to attenuate unwanted out of band signals to produce a filtered signal. The data recovery stage recovers raw data from the filtered signal in accordance with the particular wireless communication standard. Alternate designs being pursued at this time further include direct conversion radios that produce a direct frequency conversion often in a plurality of mixing steps or stages.

As an additional aspect, these designs are being pursued as a part of a drive to continually reduce circuit size and power consumption. Along these lines, such designs are being pursued with CMOS technology thereby presenting problems not addressed by prior art designs. For example, one common design goal is to provide an entire system on a single chip. The drive towards systems-on-chip solutions for wireless applications continues to replace traditional analog signal processing tasks with digital processing to exploit the continued shrinkage of digital CMOS technology.

One approach to current designs by the applicant herein is to reduce analog signal processing performance requirements and to compensate for the relaxed performance requirements in the digital domain to provide required system performance. This approach is beneficial in that, in addition to the reduced silicon area requirements, the digital processing is insensitive to process and temperature variations. Applications for which this trend is observed include RF receivers where the received signal is digitized as early as possible in the receiver chain using a high dynamic range analog-to-digital converter (ADC), and in a variety of calibration circuits of the radio where signal levels must be measured accurately over a wide range of values. This trend thus increases the demand for embedded low-power, low-voltage ADCs providing high dynamic range in the interface between the analog and digital processing.

A class of ADCs capable of providing high dynamic range and particularly suitable for low-power and low-voltage implementation is known as continuous-time delta sigma analog-to-digital converters (CTΣΔADCs). These ADCs can be designed to operate with supply voltages in the range of 1.2V-1.5V and current consumption as low as a few hundred μAs. One problem encountered in many modern receivers implemented with low-voltage CMOS circuitry is the problem of DC offset. This problem may originate from a variety of sources, for example LO leakage; a fraction of the LO signal couples to the LNA input and is converted down to baseband and occurs at the output of the demodulator as a DC signal. DC offset, when presented at the ADC input, reduces the effective dynamic input range of the ADC. Worst-case, the ADC input is completely saturated in DC offset and the ADC overloads, leading to a complete malfunction of the radio receiver. Thus, a solution is needed to avoid or reduce the problem DC offset of the input for the ADC.

SUMMARY OF THE INVENTION

The present invention employs a mixture of digital signal processing and analog circuitry to substantially improve the linear behavior of the basic low-order CTΣΔADC architectures. In one embodiment of the invention, a programmable current source that may sink or source current is coupled across an input resistor to sink or source current from an input node of the CTΣΔADC. The amount of current that is produced or sunk by the current source is used to compensate for DC current components of the signal s(t) and to compensate for signal swing to avoid overloading the operational amplifier based on changes in the input signal.

The input resistor generates a programmable input signal current, $i_s(t)$ according to $$i_s(t) = \frac{s(t) - V_B}{R_I}.$$

The operational amplifier of an integrator of the CTΣ-ΔADC keeps a voltage at the negative terminal of the amplifier equal to the constant bias voltage at the positive terminal, $V_B$. This offset current also is programmable. The input signal may be written as the sum of a bias term or, equivalently, a DC term and an AC term, as follows:

$$s(t) = s_{DC} + s_{AC}(t).$$

Therefore, the input current signal has a DC component of $$i_{DC} = \frac{s_{DC}}{R_I}.$$

The parameters are thus selected to compensate for a offset bias current component of an input signal.

A method of the embodiments of the present invention comprise receiving an analog signal at an input of the CTΔ-ΣADC, producing a scaled input current based on the received analog signal, wherein the scaled input current substantially matches the full scale input of the CTΔΣADC, and generating a bias current that substantially cancels an offset bias current component of the input current. The method further includes integrating the input current to produce an integrated signal representing a time averaged value of the input current to substantially remove noise from a frequency band of interest.

The method further includes coupling the integrated signal to a quantizer to produce a digital representation of the scaled analog signal coupling the digital representation of the scaled analog signal to a digital-to-analog converter (DAC) to produce a feedback current that substantially cancels a quantization noise component in the digital representation of the scaled analog signal. Producing the feedback current comprises coupling the digital representation of the scaled analog signal to a programmable digital switch wherein the programmable digital switch either sinks current from or sources current to the integrator input.

Other aspects of the present invention will become apparent with further reference to the drawings and specification, which follow.

BRIEF DESCRIPTION OF THE DRAWINGS

A better understanding of the present invention can be obtained when the following detailed description of the preferred embodiment is considered with the following drawings, in which.

DETAILED DESCRIPTION OF THE DRAWINGS

Figure 1:
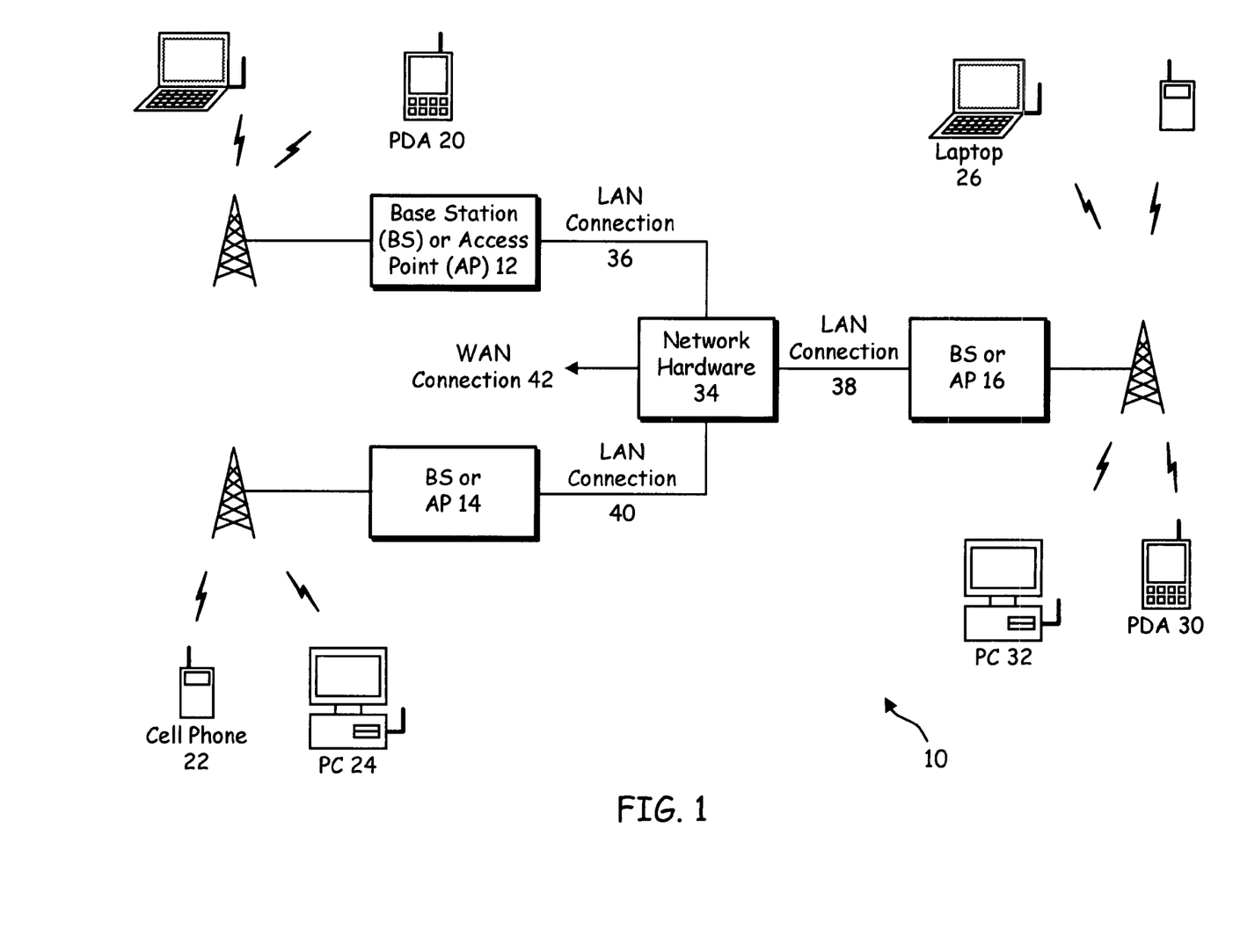
FIG. 1 is a functional block diagram illustrating a communication system that includes a plurality of base stations or access points, a plurality of wireless communication devices and a network hardware component.

FIG. 1 is a functional block diagram illustrating a communication system 10 that includes a plurality of base stations or access points (APs) 12-16, a plurality of wireless communication devices 18-32 and a network hardware component 34. The wireless communication devices 18-32 may be laptop computers 18 and 26, personal digital assistants 20 and 30, personal computers 24 and 32 and/or cellular telephones 22 and 28. The details of the wireless communication devices will be described in greater detail with reference to the following figures.

The base stations or APs 12-16 are operably coupled to the network hardware component 34 via local area network (LAN) connections 36, 38 and 40. The network hardware component 34, which may be a router, switch, bridge, modem, system controller, etc., provides a wide area network connection 42 for the communication system 10. Each of the base stations or access points 12-16 has an associated antenna or antenna array to communicate with the wireless communication devices in its area. Typically, the wireless communication devices 18-32 register with the particular base station or access points 12-16 to receive services from the communication system 10. For direct connections (i.e., point-to-point communications), wireless communication devices communicate directly via an allocated channel.

Typically, base stations are used for cellular telephone systems and like-type systems, while access points are used for in-home or in-building wireless networks. Regardless of the particular type of communication system, each wireless communication device includes a built-in radio and/or is coupled to a radio.

Figure 2:
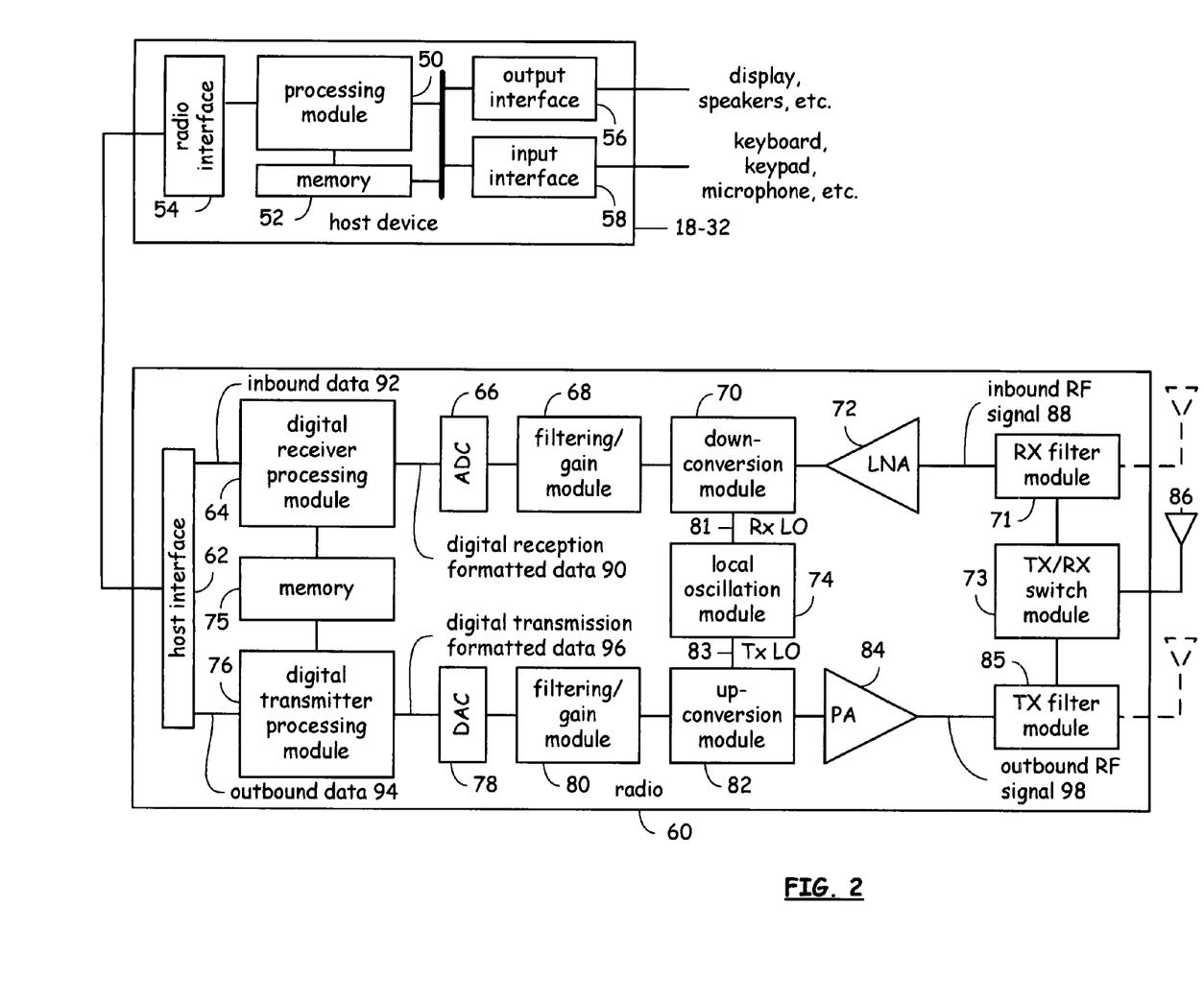
FIG. 2 is a schematic block diagram illustrating a wireless communication device that includes the host device and an associated radio.

FIG. 2 is a schematic block diagram illustrating a wireless communication device that includes the host device 18-32 and an associated radio 60. For cellular telephone hosts, the radio 60 is a built-in component. For personal digital assistants hosts, laptop hosts, and/or personal computer hosts, the radio 60 may be built-in or an externally coupled component.

As illustrated, the host device 18-32 includes a processing module 50, memory 52, a radio interface 54, an input interface 58 and an output interface 56. The processing module 50 and memory 52 execute the corresponding instructions that are typically done by the host device 18-32. For example, for a cellular telephone host device, the processing module 50 performs the corresponding communication functions in accordance with a particular cellular telephone standard.

The radio interface 54 allows data to be received from and sent to the radio 60. For data received from the radio 60 (e.g., inbound data), the radio interface 54 provides the data to the processing module 50 for further processing and/or routing to the output interface 56. The output interface 56 provides connectivity to an output device such as a display, monitor, speakers, etc., such that the received data may be displayed. The radio interface 54 also provides data from the processing module 50 to the radio 60. The processing module 50 may receive the outbound data from an input device, such as a keyboard, keypad, microphone, etc., via the input interface 58 or generate the data itself. For data received via the input interface 58, the processing module 50 may perform a corresponding host function on the data and/or route it to the radio 60 via the radio interface 54.

Radio 60 includes a host interface 62, a digital receiver processing module 64, an analog-to-digital converter 66, a filtering/gain module 68, a down-conversion module 70, a low noise amplifier 72, a receiver filter module 71, a transmitter/receiver (Tx/RX) switch module 73, a local oscillation module 74, memory 75, a digital transmitter processing module 76, a digital-to-analog converter 78, a filtering/gain module 80, an IF mixing up-conversion module 82, a power amplifier 84, a transmitter filter module 85, and an antenna 86. The antenna 86 is shared by the transmit and receive paths as regulated by the Tx/Rx switch module 73. The antenna implementation will depend on the particular standard to which the wireless communication device is compliant.

The digital receiver processing module 64 and the digital transmitter processing module 76, in combination with operational instructions stored in memory 75, execute digital receiver functions and digital transmitter functions, respectively. The digital receiver functions include, but are not limited to, demodulation, constellation demapping, decoding, and/or descrambling. The digital transmitter functions include, but are not limited to, scrambling, encoding, constellation mapping, and/or modulation. The digital receiver and transmitter processing modules 64 and 76, respectively, may be implemented using a shared processing device, individual processing devices, or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on operational instructions.

Memory 75 may be a single memory device or a plurality of memory devices. Such a memory device may be a read-only memory, random access memory, volatile memory, non-volatile memory, static memory, dynamic memory, flash memory, and/or any device that stores digital information. Note that when the digital receiver processing module 64 and/or the digital transmitter processing module 76 implements one or more of its functions via a state machine, analog circuitry, digital circuitry, and/or logic circuitry, the memory storing the corresponding operational instructions is embedded with the circuitry comprising the state machine, analog circuitry, digital circuitry, and/or logic circuitry. Memory 75 stores, and the digital receiver processing module 64 and/or the digital transmitter processing module 76 executes, operational instructions corresponding to at least some of the functions illustrated herein.

In operation, the radio 60 receives outbound data 94 from the host device 18-32 via the host interface 62. The host interface 62 routes the outbound data 94 to the digital transmitter processing module 76, which processes the outbound data 94 in accordance with a particular wireless communication standard (e.g., IEEE 802.11a, IEEE 802.11b, Bluetooth, etc.) to produce digital transmission formatted data 96. The digital transmission formatted data 96 will be a digital baseband signal or a digital low IF signal, where the low IF signal typically will be in the frequency range of one hundred kilohertz to a few megahertz.

The digital-to-analog converter 78 converts the digital transmission formatted data 96 from the digital domain to the analog domain. The filtering/gain module 80 filters and/or adjusts the gain of the analog baseband signal prior to providing it to the up-conversion module 82. The up-conversion module 82 directly converts the analog baseband signal or low IF signal into an RF signal based on a transmitter local oscillation 83 provided by local oscillation module 74. Local oscillation module 74 is, in one embodiment of the invention, a multi-stage mixer as described herein. The power amplifier 84 amplifies the RF signal to produce an outbound RF signal 98, which is filtered by the transmitter filter module 85. The antenna 86 transmits the outbound RF signal 98 to a targeted device, such as a base station, an access point and/or another wireless communication device.

The radio 60 also receives an inbound RF signal 88 via the antenna 86, which was transmitted by a base station, an access point, or another wireless communication device. The antenna 86 provides the inbound RF signal 88 to the receiver filter module 71 via the Tx/Rx switch module 73, where the Rx filter module 71 bandpass filters the inbound RF signal 88. The Rx filter module 71 provides the filtered RF signal to low noise amplifier 72, which amplifies the inbound RF signal 88 to produce an amplified inbound RF signal. The low noise amplifier 72 provides the amplified inbound RF signal to the down-conversion module 70, which directly converts the amplified inbound RF signal into an inbound low IF signal or baseband signal based on a receiver local oscillation 81 provided by local oscillation module 74. Local oscillation module 74 is, in one embodiment of the invention, a multi-stage mixer as described herein. The down-conversion module 70 provides the inbound low IF signal or baseband signal to the filtering/gain module 68. The filtering/gain module 68 may be implemented in accordance with the teachings of the present invention to filter and/or attenuate the inbound low IF signal or the inbound baseband signal to produce a filtered inbound signal.

The analog-to-digital converter 66 converts the filtered inbound signal from the analog domain to the digital domain to produce digital reception formatted data 90. The digital receiver processing module 64 decodes, descrambles, demaps, and/or demodulates the digital reception formatted data 90 to recapture inbound data 92 in accordance with the particular wireless communication standard being implemented by radio 60. The host interface 62 provides the recaptured inbound data 92 to the host device 18-32 via the radio interface 54.

As one of average skill in the art will appreciate, the wireless communication device of FIG. 2 may be implemented using one or more integrated circuits. For example, the host device may be implemented on a first integrated circuit, while the digital receiver processing module 64, the digital transmitter processing module 76 and memory 75 may be implemented on a second integrated circuit, and the remaining components of the radio 60, less the antenna 86, may be implemented on a third integrated circuit. As an alternate example, the radio 60 may be implemented on a single integrated circuit. As yet another example, the processing module 50 of the host device 18-32 and the digital receiver processing module 64 and the digital transmitter processing module 76 may be a common processing device implemented on a single integrated circuit. Further, memory 52 and memory 75 may be implemented on a single integrated circuit and/or on the same integrated circuit as the common processing modules of processing module 50, the digital receiver processing module 64, and the digital transmitter processing module 76.

The wireless communication device of FIG. 2 is one that may be implemented to include either a direct conversion from RF to baseband and baseband to RF or for a conversion by way of a low intermediate frequency. In either implementation, however, for the up-conversion module 82 and the down-conversion module 70, it is required to provide accurate frequency conversion. For down-conversion module 70 and up-conversion module 82 to accurately mix a signal, however, it is important that local oscillation module 74 provide an accurate local oscillation signal for mixing with the baseband or RF by up-conversion module 82 and down-conversion module 70, respectively. Accordingly, the local oscillation module 74 includes circuitry for adjusting an output frequency of a local oscillation signal provided therefrom. As will be explained in greater detail below, the local oscillation module 74 includes a multi-stage that receives a frequency correction input that it uses to adjust an output local oscillation signal to produce a frequency corrected local oscillation signal output. While one embodiment of the present invention includes local oscillation module 74, up-conversion module 82 and down-conversion module 70 that are implemented to perform direct conversion between baseband and RF, it is understood that the principles herein may also be applied readily to systems that implement an intermediate frequency conversion step at a low intermediate frequency.

Figure 3:
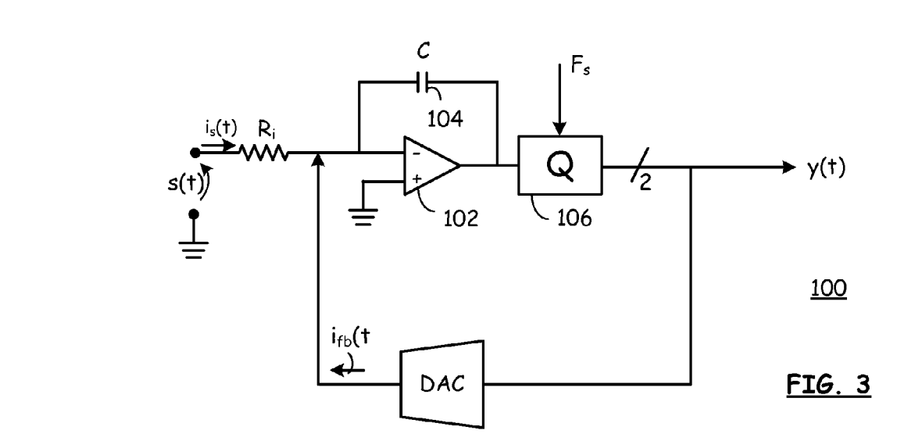
FIG. 3 illustrates an example top-level block diagram of a simplest CTΣΔADC, namely, a first-order low pass CTΣΔADC.

FIG. 3 illustrates an example top-level block diagram of the simplest CTΣΔADC, namely, a first-order low pass CTΣ-ΔADC 100. The input signal to the CTΣΔADC 100 of FIG. 3 is a voltage source, labeled s(t). An operational amplifier 102 with negative capacitive feedback provided by a capacitor 104 constitutes an integrator formed by the operational amplifier and capacitor in a feedback loop, which integrates the input current, labeled is(t), flowing from an input signal s(t) to produce an analog integrator output voltage. A coarse (in this example 2-bit) quantizer 106 converts the analog integrator output voltage signal to a digital format, shown as y(t). The quantizer 106, by providing a 2-bit output, defines which of four voltage levels most closely match the analog integrator output voltage. More specifically, the quantizer 106 produces a 2-bit output having values of 00, 01, 10 and 11.

Figure 4:
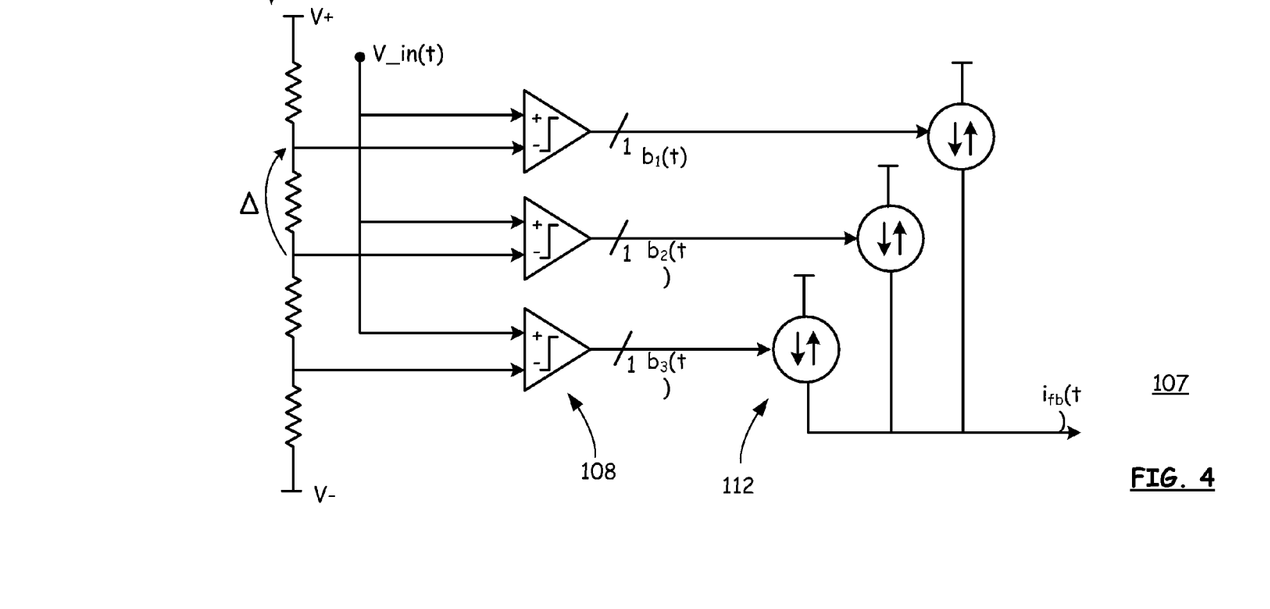
FIG. 4 illustrates one implementation of a 2-bit quantizer that produces 2-bit feedback to a DAC.

FIG. 4 illustrates one implementation of the 2-bit quantizer 107 that produces the 2-bit feedback to the DAC. The quantizer 106 typically includes an array of comparators 108, essentially 1-bit ADCs, whose output is either "high" or "low" depending upon the magnitude of the integrator voltage relative to a reference signal generated by a reference generator. A digital-to-analog converter (DAC) provides a feedback current responsive to a logic value ("1" or "0") of ADC output to the integrator. Generally, a plurality of comparators are coupled to detect a voltage drop across corresponding resistors of a plurality of series coupled resistors 110 which voltage drops serve as reference points for the comparators 108. The comparators 108 are further coupled to receive an input voltage. Each comparator 108 that has a favorable comparison resulting from the input voltage being greater than or equal to the reference voltage is operable to operatively bias a current source 112 whose outputs are added. Thus, the quantizer sums the output values of the array of comparators to produce the 2-bit output discussed above.

Figure 5:
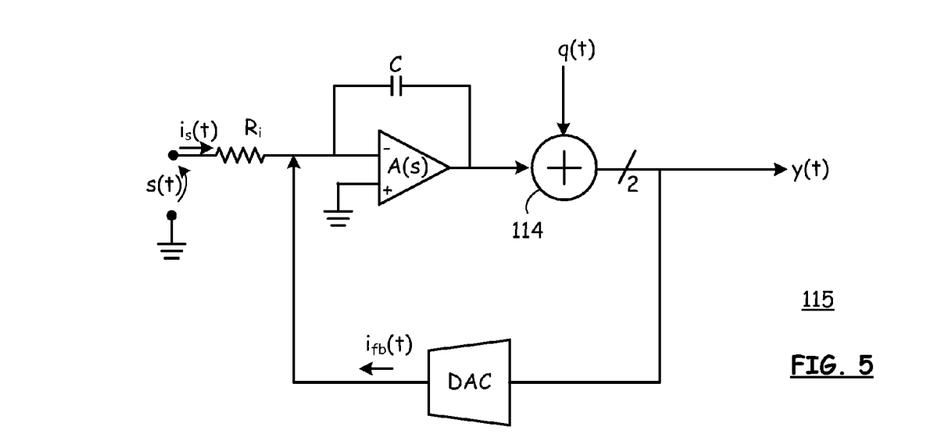
FIG. 5 illustrates an alternative model of the first-order CTΣΔADC of FIG. 1.

FIG. 5 shows an alternative model of the first-order CTΣ-ΔADC of FIG. 3, wherein the quantizer has been replaced with an additive noise source q(t) which is summed at summing element 114. The model of FIG. 5 is one that is similar to the CTΣΔADC of FIG. 3. Because the operation of the quantizer is deterministic, a signal q(t) may be defined such that a CTΣΔADC 115 of FIG. 5 behaves similarly to CTΣ-ΔADC 100 of FIG. 3. The digital ADC output, here denoted y(t), can then be written as a sum of two terms, namely, a term related to the input signal, $y_s(t)$, and a term related to the quantization noise, $y_q(t)$, i.e., $$y(t) = y_s(t) + y_q(t). \quad (1)$$

By employing feedback around the integrator and quantizer combination, it is possible to suppress the quantization noise component $y_q(t)$ in a limited frequency range around DC. Specifically, it can be shown that $y_q(t)$ results from q(t) being filtered by a first-order high-pass filter, commonly referred to as the noise transfer function, NTF(s), i.e., in terms of Laplace transforms, $$Y_q(s) = NTF(s) \times Q(s). \quad (2)$$

Similarly, for a low-frequency input signal s(t), it can be shown that the signal component $y_s(t)$ equals the input signal, i.e., in terms of Laplace transforms, $$Y_s(s) = S(s). \quad (3)$$

The above properties explain the terminology "low pass" CTΣΔADC; if s(t) is a low frequency input signal, the ADC output y(t) closely resembles s(t) when considering only the low frequency region of y(t), i.e., the ADC "passes" signals of low frequency from analog to digital format without alteration. Furthermore, the low pass CTΣΔADC of FIG. 3 is of first-order since the single integrator gives rise to a first order high pass filter. More integrators can, in principle, be added to yield higher order filtering of the quantization noise as is described further below. Generally, an $N^{th}$ order CTΣΔADC contains N integrators.

Ideally, in equation (1), the quantization noise q(t) is uncorrelated with the input signal s(t) and closely resembles white noise of power $\Delta^2/12$, where $\Delta$ is the quantizer step size (see FIG. 4) as long as the input signal is limited such that the quantizer operates in the no-overload region. In this case, the two terms that constitute y(t) in equation (1) are uncorrelated, or, equivalently, $y_q(t)$ closely resembles white noise, uncorrelated with the input, and filtered by the high pass filter NTF(s). In this case, since NTF(s) is deterministic, the power of the quantization noise measured over a given signal bandwidth, $f_c$, of the ADC output y(t) can be determined using standard linear systems analysis as $$P_n = \int_{f=0}^{f=f_c} \frac{\Delta^2}{12} |NTF(e^{j2\pi f})|^2 \, df. \quad (4)$$

For a given known input signal power, $P_s$, the signal-to-noise ratio (SNR)—a measure of the quality of the analog-to-digital conversion process—can then be calculated a-priori according to $$SNR = \frac{P_s}{P_n}. \quad (5)$$

Some properties of the ideal CTΣΔADC, where q(t) resembles white and random noise, follow from equations (4) and (5). For a given fixed $f_c$, which depends upon the particular application, the SNR depends upon the input as would be expected from a linear system with q(t) contributing constant noise power at the output. In other words, any change of signal power leads to an identical change of SNR in the ADC output. For example, suppose that the signal power is doubled, e.g., increases by 6 dB, it then follows from (5) that the SNR increases by 6 dB.

Being able to a-priori reliably predict the SNR of the analog-to-digital converted signal, as in equations (4) and (5), is extremely important in almost all applications. Having a-priori knowledge of the SNR delivered by the ADC to within tight tolerances allows system designers to quantify the performance and behavior of the overall system under a variety of different operating conditions. In practice, in order to produce the SNR needed for accurate digital processing of the input signal s(t), a digital filter is used to filter out frequency components above $f_c$ in the ADC output signal. As a result of this filtering process, the coarsely quantized output of the CTΣΔADC undergoes a significant increase in bit-resolution.

As it is obviously desirable to maintain a maximum signal-to-noise ratio, it is commonplace to optimize a particular ADC to compensate for various non-changing signal conditions to process a maximum signal swing. Accordingly, if a signal characteristic changes, the performance of the ADC may be reduced and, alternatively, the signal-to-noise ratio of the ADC may be reduced. For example, a single signal source may, for a variety of reasons, have changing levels of a DC component of a signal due to circuit operational mode or conditions. Alternatively, a single ADC may be used to sample signals from one of a plurality of signal sources. Each signal source may well have differing DC components thereby negatively affecting the performance of the ADC. For many applications, however, the ADC may be used as a part of a radio front end and tend to saturate with DC and very low frequency components of a signal.

Figure 6:
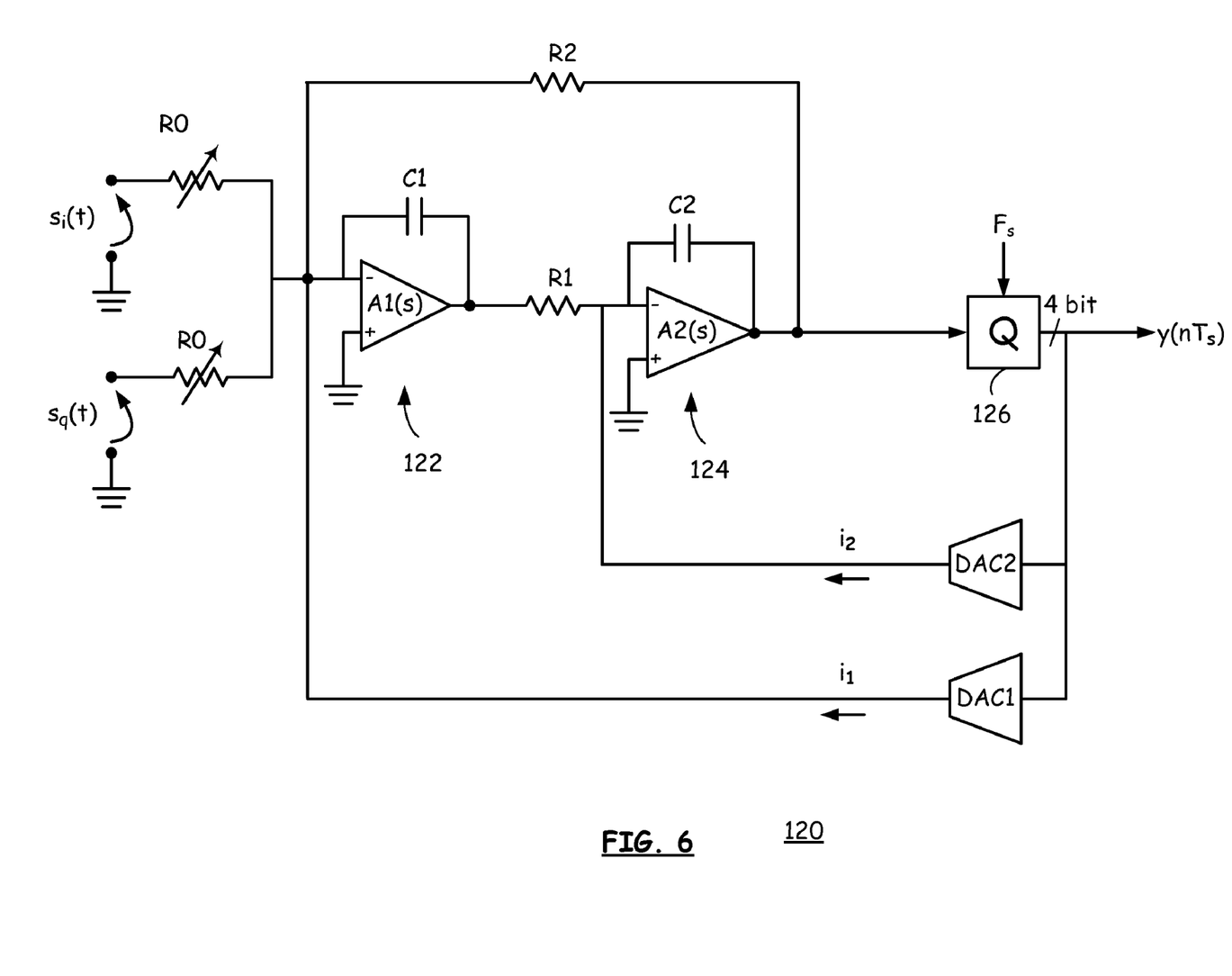
FIG. 6 is a functional schematic block diagram of a second order CTΣΔADC according to one embodiment of the invention.

FIG. 6 is a functional schematic block diagram of a second order CTΣΔADC 120 according to one embodiment of the invention. The CTΣΔADC of FIG. 6 includes two integrators and is operable to receive quadrature input signals $s_i(t)$ and $s_q(t)$ and to produce a combined digital output $y(nT_s)$. Fundamentally, the ADC operation is similar to that described above with the difference being the topology being formed to create a second order ADC.

More specifically, a first integrator shown generally at 122 comprises an amplifier coupled in parallel with a capacitor in a feedback loop about the amplifier in a common integrator configuration. A second integrator shown at 124 is coupled to receive an output of the first integrator 122 and produces an output to four bit wide quantizer 126. The second order CTΣ-ΔADC further includes a feedback path with a resistor R2 from the output of the second integrator 124 to the input of the first integrator 122.

Figure 7:
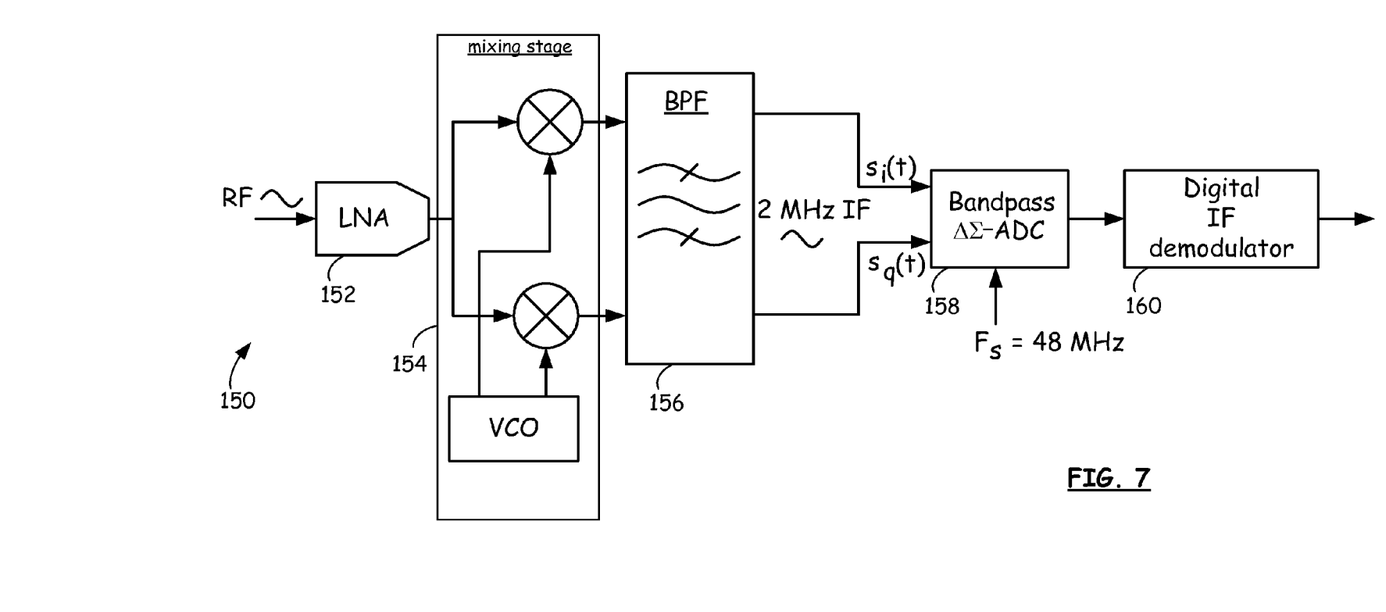
FIG. 7 is a functional block diagram of a radio receiver formed according to one embodiment of the present invention.

FIG. 7 is a functional block diagram of a radio receiver formed according to one embodiment of the present invention. FIG. 7 shows but one of a large number of applications for an ADC formed according to an exemplary embodiment of the invention. A radio receiver 150 includes a low noise amplifier 152 for amplifying a received radio frequency (RF) signal. An amplified signal is then produced to a mixing stage 154 which is operable to down convert the amplified RF signal to, in the described embodiment, an intermediate frequency (IF) signal of approximately 2 MHz. The IF signal is then produced to bandpass filter 156 for producing a filtered IF signal. The filtered IF signal is then produced to a bandpass delta-sigma analog-to-digital converter 158. In the described example, the bandpass ADC 158 operates at a 48 MHz sample rate. The bandpass ADC 158 produces an ingoing digital IF signal to a digital demodulator 160 which is operable to demodulate the digital IF signal for subsequent processing by a radio processor.

Utilizing bandpass ADC 158 as shown is advantageous in that bandpass ADC 158 is operable to operate at a sufficiently high sample rate to receive an IF signal, for example, a 2 MHz signal, to produce ingoing digital data. Heretofore, receiver designs commonly employed at two-step down conversion process from RF. Initially, an RF signal would be converted to IF and then, in a second step, to baseband frequencies. One problem, though, as addressed below, is that of DC offset. DC offset is a known problem and has also been a consideration in the design of receivers having two stages for down converting received RF.

Figure 8:
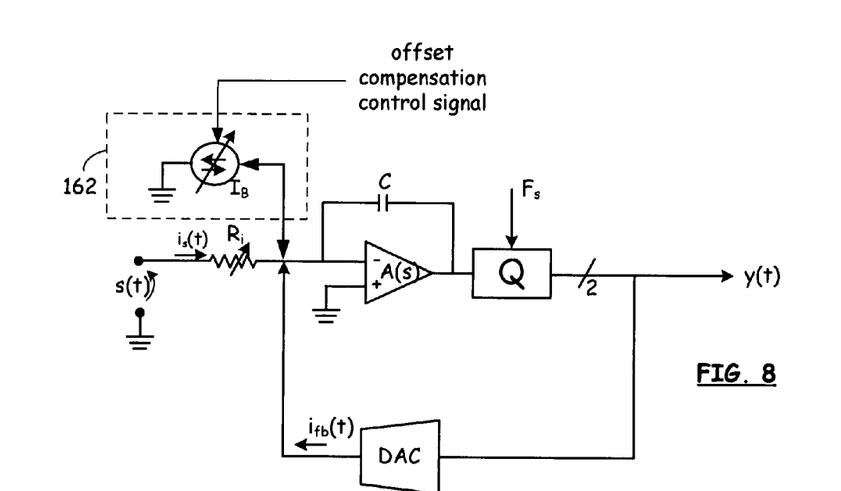
FIG. 8 is a functional schematic diagram of a first order CTΣΔADC formed according to one embodiment of the present invention.
Figure 11:
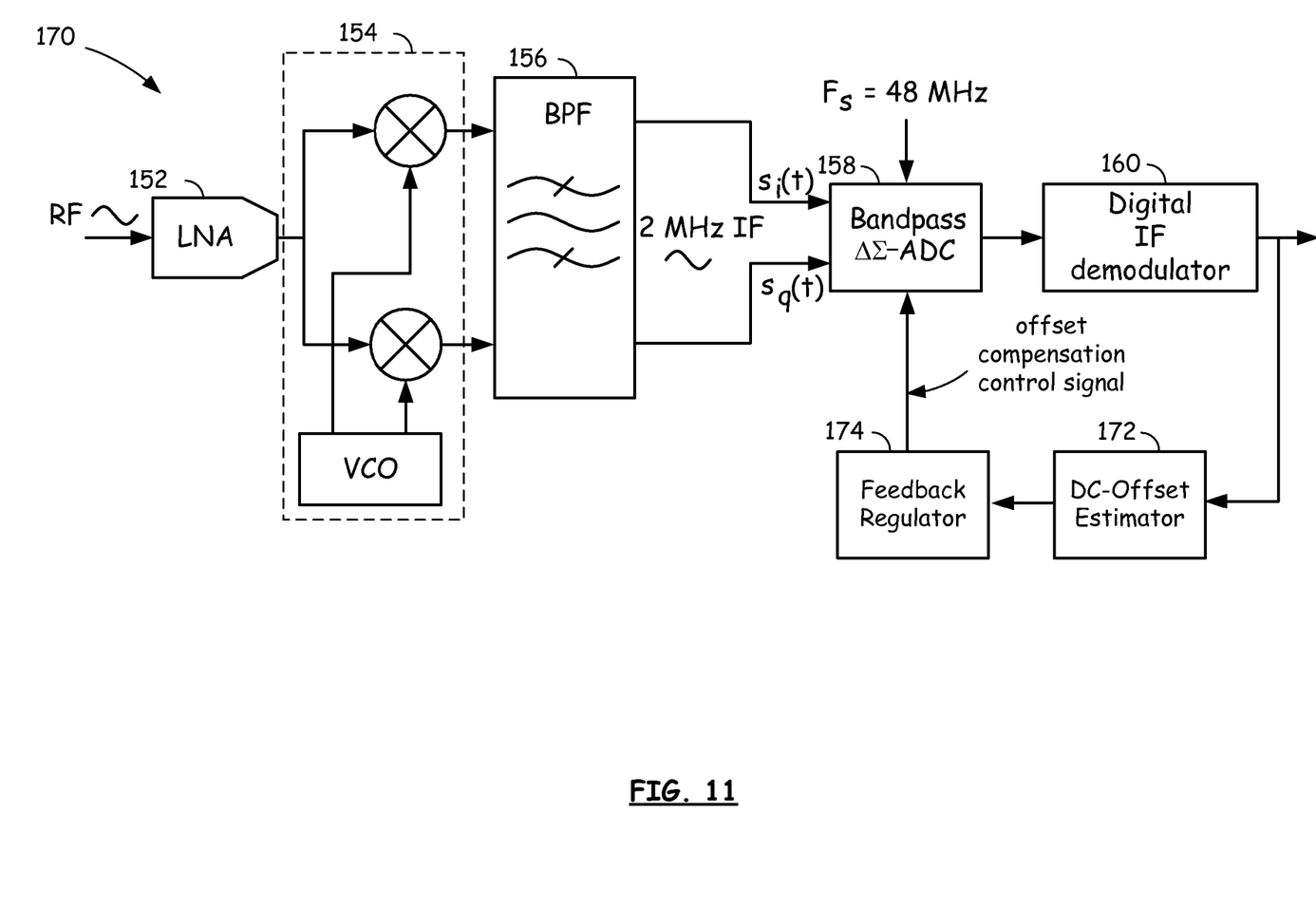
FIG. 11 is a functional block diagram of a receiver formed according to one embodiment of the invention.
Figure 12:
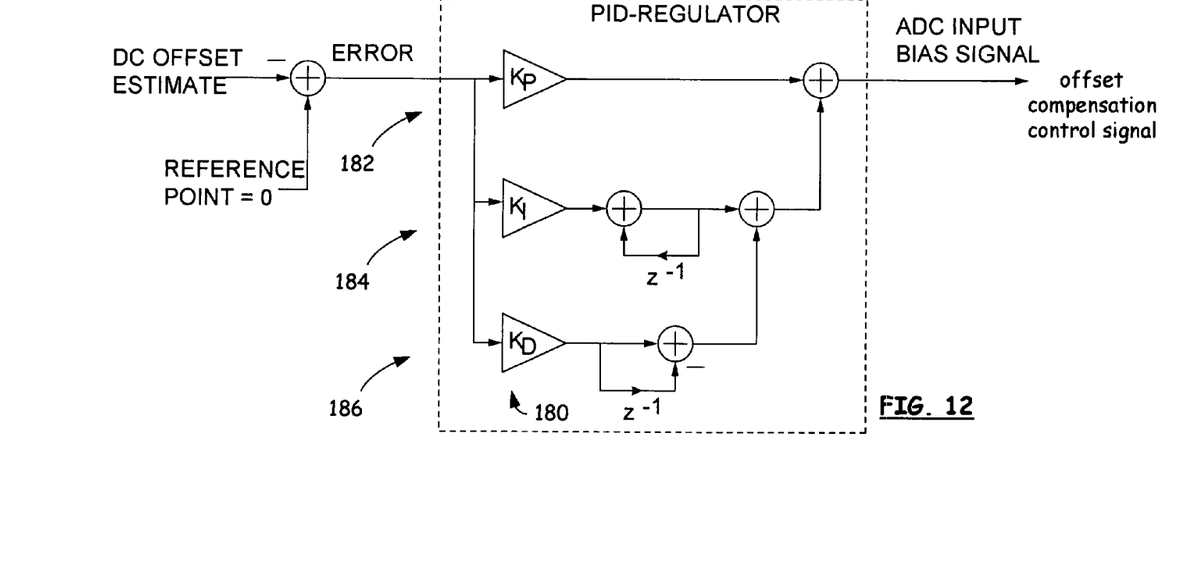
FIG. 12 is a block diagram of an example regulator for application in a feedback loop of a receiver according to one embodiment of the invention.

FIG. 8 is a functional schematic diagram of a first order CTΣΔADC formed according to one embodiment of the present invention. The circuit of FIG. 8 shows conceptual mechanisms for input range programmability. As may be seen, an input s(t) is produced to an input resistor $R_i$ prior to being produced to a negative terminal of an operational amplifier. Additionally, a programmable input block 162 operably coupled to receive an offset compensation control signal and to produce a scaled analog signal to compensate for a DC offset based upon the offset compensation control signal. Programmable input block 162, which comprises a current source that may sink or source current based upon the offset compensation control signal, is further coupled to the negative input node of the operational amplifier. The amount of current that is produced or sunk by current source $I_B$ is used to compensate for DC current components of the signal s(t) and to compensate for signal swing to avoid overloading the operational amplifier based on changes in the input signal. The offset compensation control signal is produced by a feedback regulator as shown in FIGS. 11 and 12 below.

As indicated above, $R_i$ generates a programmable input signal current, $i_s(t)$ according to $$i_s(t) = \frac{s(t) - V_B}{R_i}. \quad (6)$$

The operational amplifier of the integrator keeps the voltage at the negative terminal equal to the constant bias voltage at the positive terminal, $V_B$. The programmable input block 162 of FIG. 8 includes a programmable input offset current generator that generates an offset current $I_B$. The input signal may be written as the sum of a bias term or, equivalently, a DC term and an AC term, as follows:

$$s(t) = s_{DC} + s_{AC}(t). \quad (7)$$

Therefore, from (6) one may determine that the input current signal has a DC component of $$i_{DC} = \frac{s_{DC}}{R_I}. \tag{8}$$

Thus, to find the bias point of the input signal, it is noted that the total sum of bias currents going into the input node must be zero, i.e., $$I_B + i_{DC} = 0$$

or, equivalently, $$s_{DC} = -I_B R_I. \tag{9}$$

Figure 9:
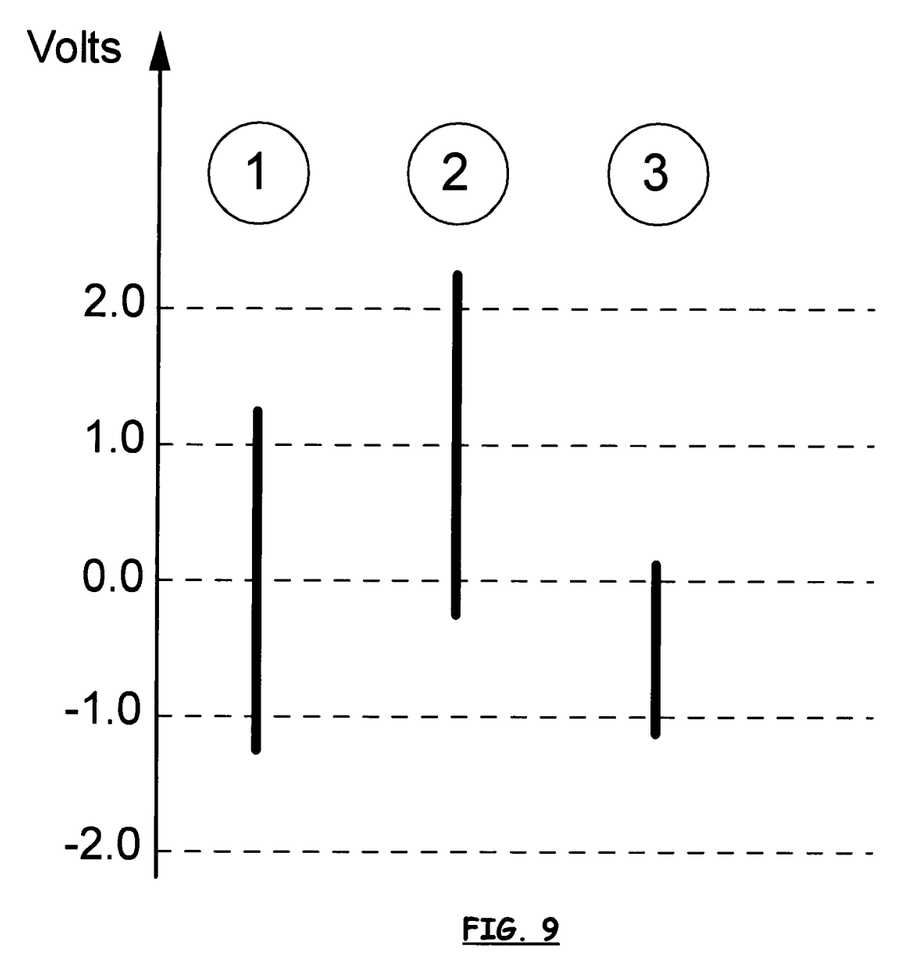
FIG. 9 illustrates an example input signal to the CTΣΔADC of FIG. 8.

FIG. 9 illustrates an example input signal to the CTΣΔADC of FIG. 8 where $I_B = 0$ and $R_I$ and the DAC are such that the input and feedback currents are equal for equal inputs, i.e., $$i_s(t)|_{s(t)=I} = i_{fb}(t)|_{y(t)=I}. \tag{10}$$

The input resistor that satisfies this requirement is referred to as $$R_{REF}. \tag{11}$$

Specifically, the signal is a 125 kHz sinusoid of amplitude 1.25V and thus is of the form (7) where $$s_{DC} = 0; \; s_{AC}(t) = 1.25 \sin(2\pi 125 e^3). \tag{12}$$

FIG. 9 shows three different example input ranges that can be achieved for the CTΣΔADC of FIG. 7 without sacrificing SNR by applying the circuitry specified in the above. Input range 1, i.e., the range

[−1.25; 1.25] Volts corresponds to the input range in the above example. Input range 2, i.e., the range

[−0.25; 2.25] Volts corresponds to input range 1 with a DC offset of +1.0 Volt. Thus, according to (9), an input offset current generator must be applied such that $$I_B = -\frac{1.0}{R_I}. \tag{13}$$

Returning to FIG. 9, as can be seen, input signal range example 3 is the range

[−1.125; 0.125] Volts.

Thus, this input range has a DC offset of −0.5 Volts and is only half the magnitude of the example input range 1. Thus, according to (9), (10), and (11), the input resistor and bias current generator must satisfy $$R_I = \frac{R_{REF}}{2} \tag{14}$$

and $$I_B = -\frac{1.0}{R_I} = -\frac{2.0}{R_{REF}}.$$

Figure 10:
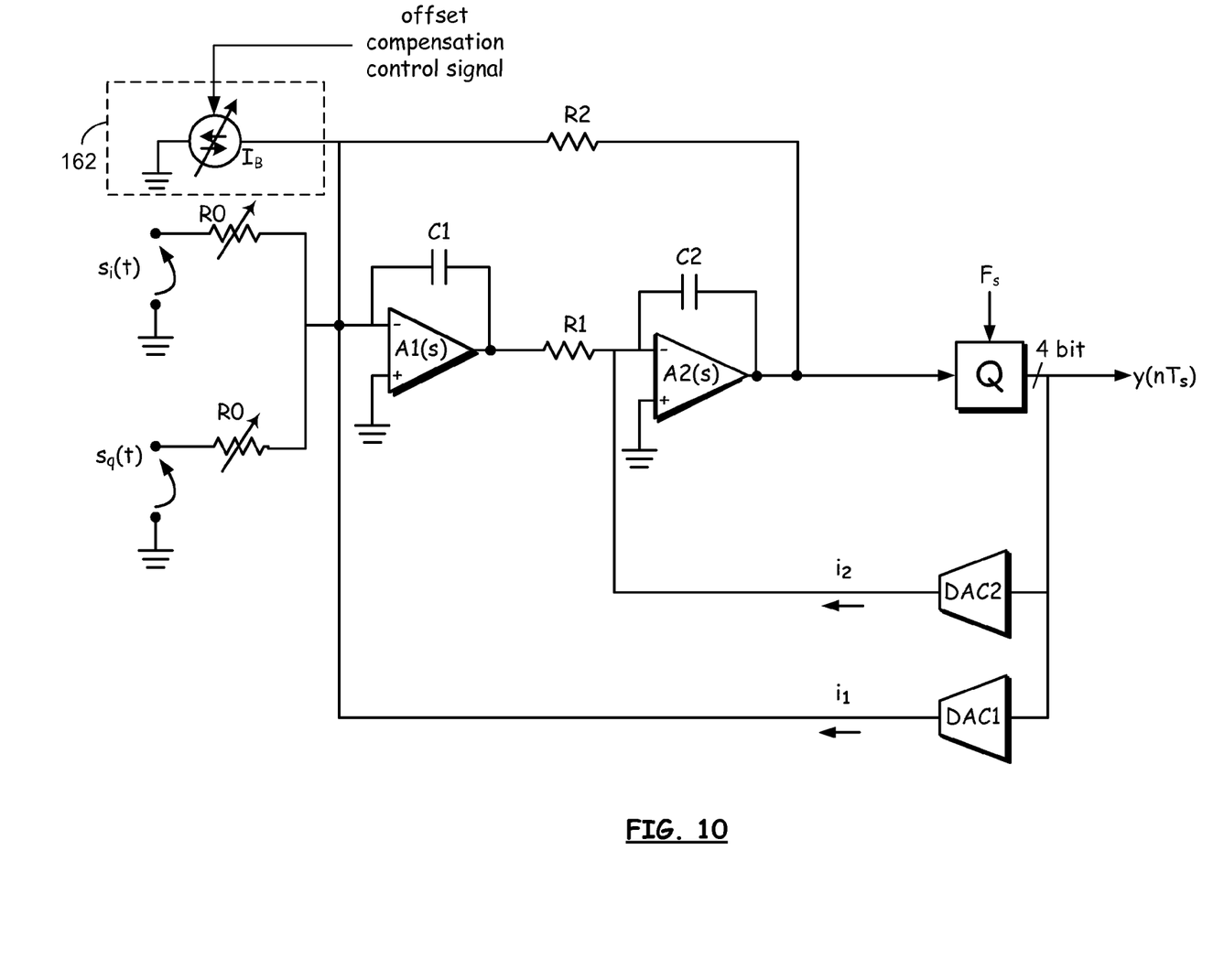
FIG. 10 illustrates a second order CTΣΔADC with dual inputs.

The results of the above analysis can readily be extended to higher order CTΣΔADCs. For example, FIG. 10 illustrates a second order CTΣΔADC with dual inputs. These inputs correspond to in-phase and quadrature (I/Q) components of the wireless RF receiver. As for the case of the single-input ADCs discussed above, the current generator of programmable input block 162 generates an offset on the input signal ranges. In this case, however, the input DC offset on each input branch is given by $$s_{DC} = -\frac{I_B R_I}{2} \tag{15}$$

since each input contributes equally in canceling the bias current.

The variable current source of programmable input block 162 is therefore operable to cancel out or at least adequately reduce any DC offset to an acceptable value. One aspect of the present invention therefore includes determining an appropriate magnitude of a current that is added and a sign of the current (i.e., whether to sink or source current).

FIG. 11 is a functional block diagram of a receiver formed according to one embodiment of the invention. Generally, FIG. 11 shows a top level block diagram for a receiver 170 with DC offset cancellation according to one embodiment of the invention. More specifically, an ingoing RF signal is received by a low noise amplifier (LNA) 152 that produces an amplified ingoing RF signal. A mixing stage 154 comprising mixers and an oscillation source comprised of, in the present example, a voltage controlled oscillator (VCO), is operable to produce a down-converted ingoing signal which, in the described embodiment, is at an intermediate frequency (IF). In one embodiment, the down-converted ingoing signal is a 2 MHz signal. The mixing stage 154 produces in-phase and quadrature components of the down-converted ingoing signal to bandpass filter 156 which produces a bandpass filtered ingoing signal having in-phase and quadrature components at IF. The in-phase and quadrature components are referenced in FIG. 11 and above as $s_i(t)$ and $s_q(t)$.

The in-phase and quadrature components $s_i(t)$ and $s_q(t)$ are produced to a bandpass second order CTΣΔADC with dual inputs, as described in relation to FIG. 10 in the described embodiment of the invention.

For example, the variable current source $I_B$ of FIG. 10 is controlled by a feedback regulator 174. An ADC input bias current, as described above, is used to bias, or cancel, a DC offset present at the demodulator output as specified by (15). As shown in the figure, to the degree that the DC offset is time-varying, a feedback regulator measures the demodulator output DC offset and adjusts the bias current IB until DC offset is cancelled or sufficiently insignificant.

FIG. 12 is a block diagram of an example regulator for application in a feedback loop of a receiver according to one embodiment of the invention. This regulator structure is a so called "PID regulator". A DC offset estimate is received and is subtracted from a reference signal which, in the described embodiment, is set to zero to produce an error signal. The error signal is defined as the difference between a programmable desired reference point, here zero, and the current estimate of the DC offset as output by the DC offset estimator. As indicated, the name "PID regulator" refers to the fact that the regulator output signal, here equal to the ADC input bias signal, depends upon three terms related to the error signal: a proportionality term (P), an integral term (I), and a differential term (D). Each such term is weighted by a scaling factor, i.e., by factors $K_P$, $K_I$, and $K_D$, respectively, by the multipliers shown generally at 180 for rows 182, 184 and 186. The specific choices of values for these regulator gains depend upon the desired feedback system dynamics and may readily be determined by one of average skill in the art. It is understood that a reduced version of the PID regulator may be applied, i.e., a version where one or more gain factors are zero. The output of PID-Regulator of FIG. 12 is the offset compensation control signal that is produced to cause current to be removed or added to the input of an integrator of an ADC as described herein.

Figure 13:
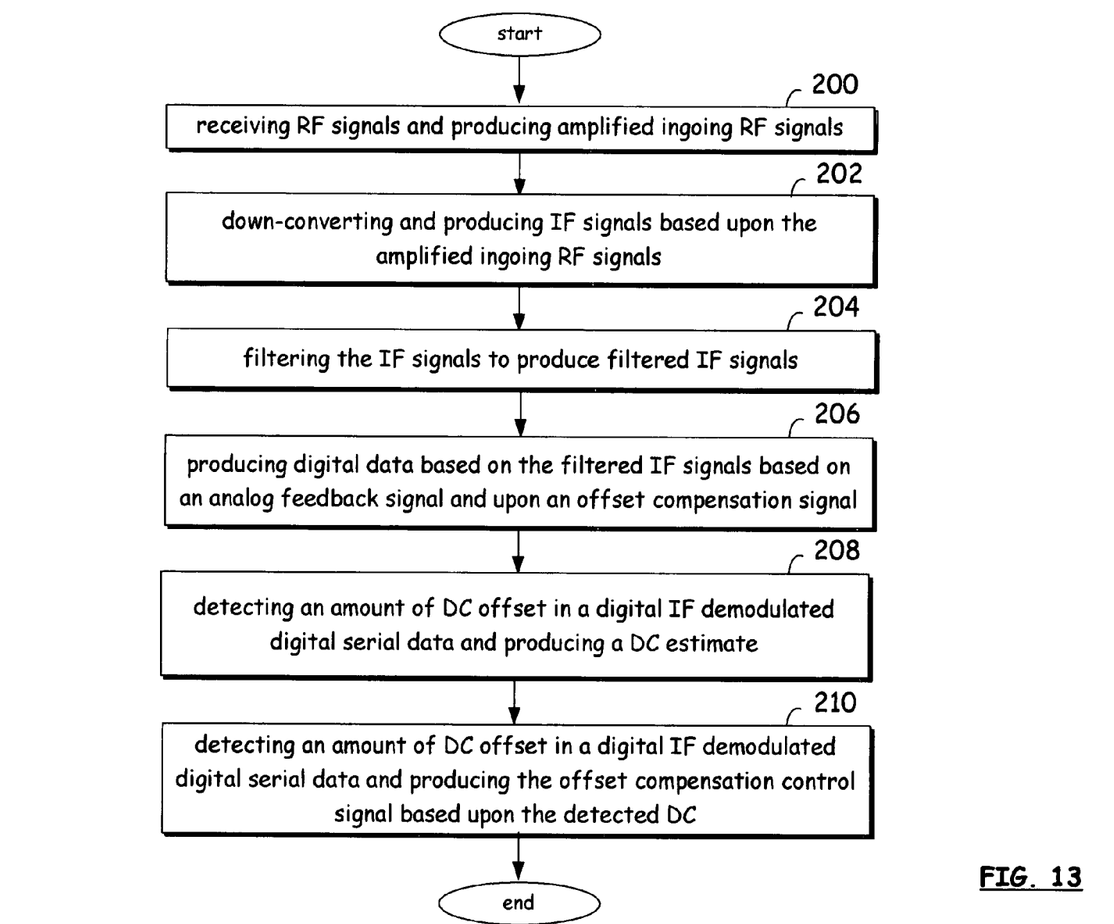
FIG. 13 is a flowchart illustrating one method of the present invention.

FIG. 13 is a flowchart illustrating one method of the present invention. Initially, the method includes receiving RF signals and producing amplified ingoing RF signals (step 200). The amplified ingoing RF signals are then down-converted to produce IF signals based upon the amplified ingoing RF signals (step 202). The method then includes filtering the IF signals to produce filtered IF signals (step 204). Thereafter, digital data is produced based on the filtered IF signals based on an analog feedback signal and upon an offset compensation signal (step 206).

Any DC offset that exists is typically detectable in the digital data and may be detected in a number of ways. First, if an adequate time average of digital data bits are not equal to a specified average value (e.g., zero), then bit errors are being introduced due to the DC offset. In another approach, a merely voltage measurement of the digital data may indicate the presence of a DC offset. The method thus further includes detecting an amount of DC offset in a digital IF demodulated digital serial data and producing an estimate of the DC offset (step 208). Finally, the method includes generating the offset compensation control signal based upon the DC estimate (step 210).

As one of average skill in the art will appreciate, the term "substantially" or "approximately", as may be used herein, provides an industry-accepted tolerance to its corresponding term. Such an industry-accepted tolerance ranges from less than one percent to twenty percent and corresponds to, but is not limited to, component values, integrated circuit process variations, temperature variations, rise and fall times, and/or thermal noise. As one of average skill in the art will further appreciate, the term "operably coupled", as may be used herein, includes direct coupling and indirect coupling via another component, element, circuit, or module where, for indirect coupling, the intervening component, element, circuit, or module does not modify the information of a signal but may adjust its current level, voltage level, and/or power level. As one of average skill in the art will also appreciate, inferred coupling (i.e., where one element is coupled to another element by inference) includes direct and indirect coupling between two elements in the same manner as "operably coupled". As one of average skill in the art will further appreciate, the term "compares favorably", as may be used herein, indicates that a comparison between two or more elements, items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1.

While the invention is susceptible to various modifications and alternative forms, specific embodiments thereof have been shown by way of example in the drawings and detailed description. It should be understood, however, that the drawings and detailed description thereto are not intended to limit the invention to the particular form disclosed, but, on the contrary, the invention is to cover all modifications, equivalents and alternatives falling within the spirit and scope of the present invention as defined by the claims. As may be seen, the described embodiments may be modified in many different ways without departing from the scope or teachings of the invention.

What is claimed is:

1. An integrated circuit radio receiver, comprising:
   amplification circuitry operable to receive RF signals and to produce amplified ingoing RF signals;
   mixing circuitry operable to produce IF signals based upon the amplified ingoing RF signals;
   a filtering block operable to filter the IF signals and to produce filtered IF signals;
   a multiple input programmable Continuous-Time Delta-Sigma Analog-to-Digital Converter (CTΔΣADC) coupled to receive the filtered IF signals, the programmable CTΔΣADC operable to produce digital data based on the filtered IF signals, wherein the programmable CTΔΣADC includes:
   a programmable input block operably coupled to receive an offset compensation control signal and operable to produce a scaled analog signal to compensate for a DC offset based upon the offset compensation control signal; and
   CTΔΣADC processing block operable to convert the filtered IF signals to digital data;
   digital IF demodulator operable to produce digital IF demodulated digital serial data based upon the digital data produced by the programmable CTΔΣADC; and
   DC offset compensation logic operable to produce an offset compensation control signal based upon a detected amount of DC in the digital IF demodulated digital serial data.

2. The integrated circuit radio receiver of claim 1 further including:
   at least one integrator operably coupled to receive the scaled analog signal and operable to produce at least one integrated output.

3. The integrated circuit radio receiver of claim 2 further including:
   a quantizer operably coupled to receive the at least one integrated output and operable to produce a digital output having a digital value coarsely reflecting an amplitude of the analog signal.

4. The integrated circuit radio receiver of claim 3 further including:
   at least one programmable digital-to-analog converter (DAC) operably coupled to receive and to convert the quantizer digital output to an analog programmable feedback current coupled to an integrator input.

5. The integrated circuit radio receiver of claim 4 wherein the programmable input block farther includes:
   a programmable bias current block operably coupled to the integrator input to produce a programmable bias current to substantially cancel a bias voltage component of the received scaled analog signal based upon an offset compensation control signal.

6. The integrated circuit radio receiver of claim 4 wherein the DC offset compensation logic is operably coupled to select an offset bias signal level to the programmable CTΔΣADC further comprising a DC offset estimator for producing an estimate of a DC offset value based upon a characteristic of a digital IF demodulated signal produced by the digital IF demodulator.

7. The integrated circuit radio receiver of claim 6 further including a feedback regulator for generating the offset compensation control signal based upon the estimate of the DC offset value.

8. The integrated circuit radio receiver of claim 7 further including a second order CTΔΣADC comprising first and second serially coupled integrators and first and second corresponding DACs operably coupled to receive and to convert the quantizer digital output to an analog programmable feedback current coupled to the integrator input for the corresponding integrator.

9. The integrated circuit radio receiver of claim 8 wherein the output of the first DAC, the input of the first serially coupled integrator, and the output of the programmable bias current block are all operably coupled by a common node.

10. The integrated circuit radio receiver of claim 9 wherein the CTΔΣADC processing block is operable to produce a four bit wide digital data output.

11. A method in an integrated circuit radio receiver, comprising:
receiving RF signals and producing amplified ingoing RF signals;
down-converting and producing IF signals based upon the amplified ingoing RF signals;
filtering the IF signals to produce filtered IF signals;
producing digital data;
producing digital IF demodulated digital serial data based on the digital data;
detecting, in DC offset compensation logic, an amount of DC offset in the digital IF demodulated digital serial data and producing an offset compensation control signal based upon the detected amount of DC offset;
producing an analog feedback signal based on the digital data; and
wherein producing digital data is based on the filtered IF signals, the analog feedback signal and upon the offset compensation control signal.

12. The method of claim 11 further including producing a digital output having a digital value coarsely reflecting an amplitude of the analog feedback signal.

13. The method of claim 12 further including producing a programmable bias current to substantially cancel a bias voltage component of the received analog feedback signal based upon an offset compensation control signal.

14. The method of claim 13 further including producing an estimate of a DC offset value based upon a characteristic of a digital IF demodulated signal.

15. The method of claim 14 further including generating the offset compensation control signal based upon the estimate of the DC offset value.

16. The method of claim 15 further including producing a four bit wide digital data output.

17. The method of claim 11 further including evaluating a plurality of digital data bits from the digital data for detectable effects of the DC offset.

18. The method of claim 17 wherein an average DC value is detected in the digital data.

19. An integrated circuit radio receiver, comprising:
amplification circuitry coupled to receive RF signals and operable to produce amplified ingoing RF signals;
mixing circuitry operable to produce IF signals based upon the amplified ingoing RF signals;
filtering block operable to filter the IF signals to produce filtered IF signals;
a multiple input programmable Continuous-Time Delta-Sigma Analog-to-Digital Converter (CTΔΣADC) coupled to receive the filtered IF signals, the programmable CTΔΣADC operable to produce digital data based on the filtered IF signals, wherein the programmable CTΔΣADC includes:
a programmable input block operably coupled to receive an offset compensation control signal and to produce a scaled analog signal to compensate for a DC offset based upon the offset compensation control signal; and
CTΔΣADC processing block operable to convert the filtered IF signals to the digital data;
digital IF demodulator operable to produce the digital IF demodulated digital serial data based upon the digital data produced by the programmable CTΔΣADC; and
DC offset compensation logic operable to produce an offset compensation control signal based upon a detected amount of DC in the digital IF demodulated digital serial data wherein the DC offset compensation logic is operable to determine a DC offset estimation amount and to produce the offset compensation control signal based on the DC offset estimation amount.

* * * * *